(12) United States Patent
Bezencon et al.

(10) Patent No.: US 7,744,348 B2
(45) Date of Patent: Jun. 29, 2010

(54) METHOD OF PRODUCING A HOT GAS COMPONENT OF A TURBOMACHINE INCLUDING AN EMBEDDED CHANNEL

(75) Inventors: Cyrille Bezencon, Chermignon (CH); Bernd Fehrmann, Baden (CH); Matthias Hoebel, Windisch (CH); Maxim Konter, Klingnau (CH); Wilfried Kurz, La Conversion s. Lutry (CH); Jean-Daniel Wagnière, Boussens (CH)

(73) Assignee: ALSTOM Technology Ltd., Baden (CH)

( * ) Notice: Subject to any disclaimer, the term of this patent is extended or adjusted under 35 U.S.C. 154(b) by 216 days.

(21) Appl. No.: 11/763,610

(22) Filed: Jun. 15, 2007

(65) Prior Publication Data

US 2007/0253817 A1 Nov. 1, 2007

Related U.S. Application Data

(63) Continuation of application No. PCT/EP2005/056979, filed on Dec. 20, 2005.

(30) Foreign Application Priority Data

Dec. 24, 2004 (CH) .................................. 02147/04

(51) Int. Cl.
*F01D 5/18* (2006.01)
(52) U.S. Cl. .................. 416/97 R; 416/241 R
(58) Field of Classification Search .............. 416/236 R
See application file for complete search history.

(56) References Cited

U.S. PATENT DOCUMENTS

| 2,641,439 | A | * | 6/1953 | Williams | ................ | 416/241 R |
| 4,023,249 | A | | 5/1977 | Darrow et al. | | |
| 5,640,767 | A | | 6/1997 | Jackson et al. | | |
| 6,214,248 | B1 | | 4/2001 | Browning et al. | | |
| 6,405,435 | B1 | * | 6/2002 | Konter et al. | ............... | 29/889.7 |
| 6,617,003 | B1 | * | 9/2003 | Lee et al. | ................ | 416/241 R |

(Continued)

FOREIGN PATENT DOCUMENTS

DE 931017 7/1955

(Continued)

OTHER PUBLICATIONS

Search Report for Swiss Patent App. No. 2147/04 (Apr. 19, 2005).

(Continued)

*Primary Examiner*—Richard Edgar
(74) *Attorney, Agent, or Firm*—Cermak Nakajima LLP; Adam J. Cermak

(57) ABSTRACT

A component, especially a hot gas component of a turbomachine, has at least one passage (7, 7'), especially a cooling passage, which is embedded in an outer wall (5) of the component (1) of the turbomachine and basically extends parallel to the surface (6) of the component (1). The component (1) has a basic body (8) and at least one coating (9) which is applied to the basic body on the outside, and the passage (7, 7') on one hand is formed by a cavity which is formed in the basic body (8), and on the other hand is closed off towards the surface (6) of the component (1) by the coating (9).

11 Claims, 3 Drawing Sheets

U.S. PATENT DOCUMENTS 7,186,091 B2 * 3/2007 Lee et al. ................ 416/241 B
2006/0222492 A1 * 10/2006 Gross ....................... 416/97 R

FOREIGN PATENT DOCUMENTS

| DE | 3706260 | 9/1988 |
|---|---|---|
| EP | 0113883 | 7/1984 |
| EP | 1001055 | 5/2000 |
| EP | 1295970 | 3/2003 |
| EP | 1462611 | 9/2004 |
| EP | 1462613 | 9/2004 |
| GB | 791751 | 12/1954 |
| WO | WO97/35678 | 10/1997 |
| WO | WO2006/069941 | 7/2006 |

OTHER PUBLICATIONS

International Search Report for PCT Patent App. No. PCT/EP2005/056979 (Mar. 9, 2006).

* cited by examiner

METHOD OF PRODUCING A HOT GAS COMPONENT OF A TURBOMACHINE INCLUDING AN EMBEDDED CHANNEL

This application is a Continuation of, and claims priority under 35 U.S.C. §120 to, International application no. PCT/EP2005/056979, filed 20 Dec. 2005, and claims priority therethrough under 35 U.S.C. §119 to Swiss application no. 02147/04, filed 24 Dec. 2004, the entireties of both of which are incorporated by reference herein.

BACKGROUND

1. Field of Endeavor

The present invention relates to a component, especially a hot gas component of a turbomachine, with at least one passage which is embedded in an outer wall of the component and basically extends parallel to and close to the surface of the component, which passage is especially to serve for intake of a cooling medium.

Furthermore, the invention relates to a method for producing at least one such passage in a component.

2. Brief Description of the Related Art

Modern turbomachines, like, for example, gas turbines, are exposed to high loads during operation. They are often operated with hot gases at more than 800° C., and at the same time are subjected to high mechanical loads. The increase of turbine output capacity during the last decades is fundamentally based on two improvements. On one hand, continuously new efficient materials were developed, like, for example, monocrystal alloys, as a result of which the load capacity of the components which lie in the flow cross section of the hot gases could be increased, and on the other hand, cooling systems and temperature protective coatings, which were improved time and again, were developed, which resulted in an increase of the turbine inlet temperatures, and, as a result, an increase of the turbine output. Monocrystal alloys, like, for example, CMSX2, CMSX4, or MK4, have especially led to an appreciable reduction of the temperature sensitivity, and, as a result, to appreciably improved mechanical properties at high temperatures. Since the output capacity of gas turbines is directly coupled with the inlet temperature of the hot gases, for years a continuous increase of the hot gas temperature has been noted, so that especially in the first turbine stages gas temperatures are already achieved which exceed the melting temperatures of the alloys which are used there. In order to prevent damage of the hot gas components or the alloys which are used, as the case may be, complex internal cooling systems were developed, which cool the components which lie in the flow cross section in such a way that these lie below a critical temperature limit at which the components would be damaged. In this case, it is common to all cooling systems that a compromise has to be made between the desired cooling effect, the amount of cooling air which is available, and the costs.

The cooling air which is required for cooling is generally delivered from a compressor and, by means of an internal cooling system, is distributed to the components which are to be cooled.

As a rule, different cooling methods, like, for example, such methods which are based on a convective heat transfer, are combined with a film cooling or transpiration cooling. In this case, the components have internal cooling passages, for example, which extend in serpentine-like fashion and which interact in a communicating manner with a multiplicity of discharge openings on a surface of the component, as a result of which a film cooling or transpiration cooling is created. An especially effective cooling is achieved in this case, if the wall which is to be cooled has a wall thickness which is as small as possible (EP 0 964 981).

Calculations have proved that in a development of a cooling method of a hot gas component to the effect that a system of cooling passages which is close to the surface is created, which cooling passages communicate at least by their one end with the internal cooling medium passages which pass through the inside of the blade mostly in serpentine form, while at least one other end is connected to cooling paths which lead to the surface and effect a film cooling or transpiration cooling there, lead to an increase of the turbine inlet temperature by 50K to 125K, and lead to a significant enhancement of the machine output as a result of it, without additional consumption of cooling air.

Since, however, as a result of the cooling of the components, especially of the turbine blades, the overall efficiency of the power plant decreases, a compromise also has to be found here between turbine output and turbine cooling.

Another efficient, convective cooling system is effected by means of coolable wall structures, as it is proposed, for example, in EP 1 462 611, EP 1 462 612, and EP 1 462 613. In this case, the walls of the hot gas components are equipped with a network of cooling passages. In the interests of effective cooling, it is advantageous to construct these walls very thinly and to lay out the cooling passages close to the thermally stressed surface. In this way, an efficient cooling can be provided. However, such internal cooling passages are exceptionally complicated to produce in the manufacturing process and, therefore, are disproportionately expensive.

To alleviate this disadvantage, a method for producing or repairing cooling passages, which are close to the surface, in a hot gas component of the gas turbine has become known, which is basically based on a profile being applied to a basic body of this component, which profile corresponds to the later structure of the cooling passages. This can be carried out either in the way by a thermally stable filling material in a corresponding structure being applied to the surface of the basic body, or by this structure first being mechanically machined from out of the surface of the basic body and the cavities which result from it then being filled with the thermally stable filling material. In a subsequent step, a coating material is applied by means of a coating method, at least in the region of the cooling structure. The cooling passages are opened by means of subsequent removal of the filling material.

This proposal which forms a generic type is disclosed in EP 1 065 026 and also in later publications, like EP 1 462 611 and EP 1 462 612.

By means of these solutions, it will be possible on one hand to create a cooling passage network in a component of a turbomachine, which on one hand brings about an efficient cooling of the component on account of its position which is arranged just beneath the surface of the outer wall, and which on the other hand can dispense with costly casting molds and results in lower scrap rates. The cooling passages, which are embedded in the outer wall of the component, can generally also be combined with other cooling strategies, like, for example, the transpiration cooling which is described above, as a result of which a high flexibility and a broadened application spectrum can be achieved.

In this method, however, the relatively high manufacturing cost is still disadvantageous, especially the regular requirement of an aftertreatment for the subsequent removal of the filling material.

SUMMARY

One of numerous aspect of the present invention is based on making available a component of a turbomachine of the aforementioned type, which especially has an enhanced cooling system with greatly reduced manufacturing cost. Furthermore, another aspect of the present invention is based on making available a method for producing at least one passage which is embedded in an outer wall of such a component.

Another aspect of the present invention is based first producing in a first step the structure of the cooling medium passages on the surface of the basic body in a component of a turbomachine of the aforementioned type, and, in a further step, applying a coating material while directly bridging the cooling medium passages which are produced, without these being masked with a filling material.

According to principles of the present invention, it is possible, therefore, to create a number of cooling passages in a component of a turbomachine which on one hand are simple to produce, and on the other hand bring about efficient cooling of the component on account of their position which is arranged just below the surface of the outer wall, wherein a costly aftertreatment of the component for the purpose of removing filling material and for opening the cooling medium passages which are produced, can be omitted. Production effort, and, as a result, production costs, can also be appreciably reduced. The cavities which are introduced in the basic body can be fully automatically produced or applied, as the case may be, just as the coating, as a result of which an especially high quality, and, as a result, a high service life, ensue.

The cooling passages, which are embedded in the outer wall of the component, can generally also be combined with other cooling strategies, like, for example, transpiration cooling which is described above, as result of which an especially high flexibility and a broadened application spectrum can be achieved.

The basic body expediently has an equidirectional grain structure and/or monocrystal structure. Monocrystal structures are spoken of when the building blocks of the crystal, consequently the ions, atoms, or molecules, form a unitary, homogenous crystal lattice. By means of such a monocrystal, a slipping of the grains along the grain boundaries, for example as a result of the centrifugal forces which prevail in the turbine, is avoided, since in monocrystals there is only just one single grain which at the same time is the crystal.

In a further advantageous embodiment of the invention, at least one passage communicates with at least one discharge opening which leads to the surface of the component. As a result of this, the especially effective cooling system which extends closely beneath the surface is combined with a known film cooling, which by permanent discharge of cooling air through the discharge openings creates a cooling medium film which is distributed over the surface of the component. In this case, it concerns a so-called open cooling system, in which permanent cooling medium, as a rule air, from a cooling medium source of relatively high pressure, for example which is branched from the compressor of a gas turbine plant, is directed into the component which is to be cooled through its internal cooling passages up to the discharge openings in the outer wall.

In a further advantageous embodiment, a passage longitudinal axis is at a distance of less than 3 mm from the surface of the component. As a result of this, a direct and quick transfer of the cooling action onto the surface is possible, as a result of which an especially high cooling effect can be achieved. Furthermore, it is conceivable in this case that a plurality of passages forms a communicating passage network and so bring about a uniform, areal cooling of the surface of the component. By means of different cross sections inside the cooling passage network, furthermore, the accurate distribution of the cooling air in the component can be influenced, so that, for example, regions which are to be cooled more intensely are equipped with cooling passages of larger cross section, whereas regions which are to be cooled less intensely have cooling passages with smaller cross section.

A width of the cavity, at least in the region of a surface, is expediently less than 1 mm. The width is preferably even only 0.2 mm, as a result of which bridging of the cavity width by the applied coating is simplified. In the case of a small cavity width, too great a penetration of the applied coating into the cavity is also avoided, since the two edges or the two cavity walls, as the case may be, have a large surface in comparison to the amount of coating which has penetrated, and, as a result, bring about a quick hardening of the coating. The small width of the cavity, furthermore, has the advantage that in comparison to cavities with larger width, a close-meshed network of cooling passages can be extended on the surface of the component or of a turbine blade respectively, and, as a result, a more uniform cooling performance or individually better adaptable cooling performance, as the case may be, can be achieved.

Further important features and advantages of the turbomachine according to the invention result from the drawings, and from the associated description of the figures, with reference to the drawings.

BRIEF DESCRIPTION OF THE DRAWINGS

Preferred exemplary embodiments of the invention are shown in the drawings and explained in detail in the subsequent description, wherein like designations refer to like or similar or functionally similar components.

In the drawing, schematically in each case.

DETAILED DESCRIPTION OF EXEMPLARY EMBODIMENTS

Figure 1:
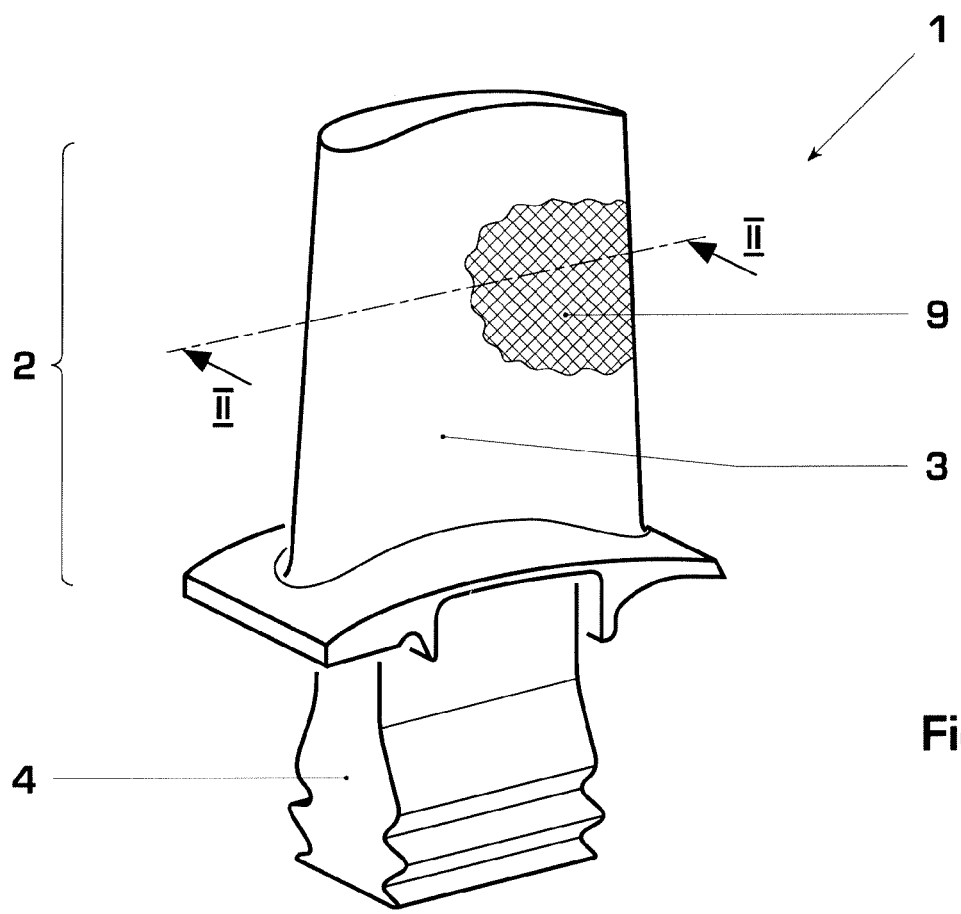
FIG. 1 shows a component of a turbomachine according to the invention, with passages which are made partially visible and embedded in the outer wall of the component.

According to FIG. 1, a component 1 of a turbomachine, which apart from that is not shown, has a region 2 which during operation of the turbomachine is flow-washed by hot gases. In the case of the component 1, as exemplarily shown in FIG. 1, it can be a blade 3, stator blade or rotor blade of a gas turbine. At its seated end, the blade 3 leads into a blade root 4, by which the blade is fastened, for example, to a stator or a rotor. In order to increase the output capacity of the turbine, turbine inlet temperatures which are as high as possible are desired. High turbine inlet temperatures, however, disadvantageously affect the service life of the components 1 which are exposed to hot gas as long as these are not adequately protected. For protection of the components 1 against the high temperatures of the hot gases, two different methods are principally adopted. On one hand, it is attempted to positively influence the temperature resistance of the components 1 which are in direct contact with the hot gases, by a corresponding material selection, like, for example, by the use of nickel-based alloys and/or thermal protection layers, and on the other hand, the components 1 are actively cooled.

A good example, for the progress in material science, is so-called monocrystal alloys, like, for example, CMSX2, CMSX4, or MK4, which are frequently used in modern machine construction. Crystals, the building blocks of which form a unitary, homogenous crystal lattice, are referred to as monocrystals.

In addition to the material selection which was mentioned, the blade 3, furthermore, can be protected against damage by the hot gases by cooling.

Figure 2:
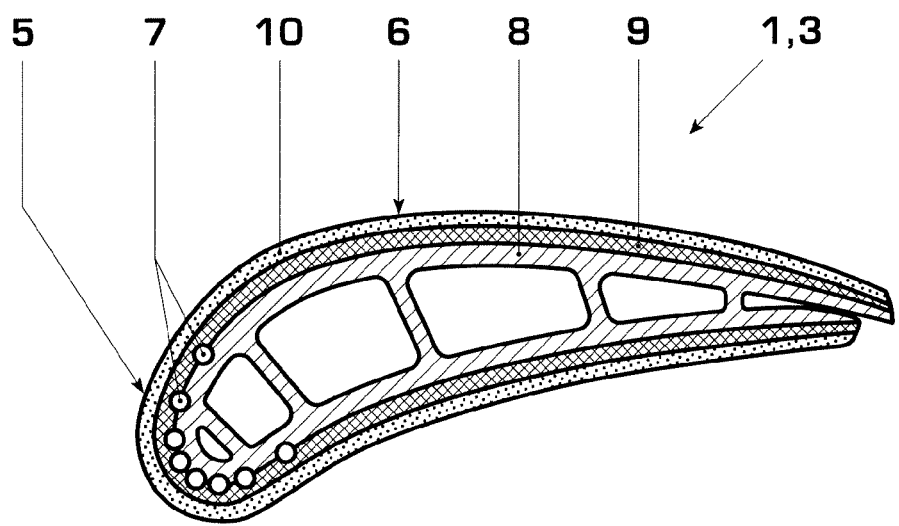
FIG. 2 shows a cross section through the component along a cutting plane II-II.

According to FIG. 2, for this purpose the blade 3 has passages 7, 7', especially cooling passages, which are embedded at least in one region of an outer wall 5 and which basically extend parallel to the surface 6 of the component 1 or the blade 3, as the case may be. The component 1 has a basic body 8, which, for example, has a equidirectional graining and at least one coating 9, for example a connecting layer, which is applied to the basic body 8 on the outer side. The passage 7, 7' in this case is formed on one hand by a cavity which is introduced in the basic body 8, and on the other hand is closed off towards the surface 6 of the component 1 by the coating 9. Furthermore, it can be provided that the coating 9 on the outside supports a thermal protection layer 10. The coating 9 in this case, for example, can be a metal coating which protects the basic body 8 against hot temperature oxidation and temperature corrosion. In this case, the coating 9 can include the same material as the basic body 8 and/or, for example, can be a MCRALY alloy, wherein M stands for nickel, cobalt, iron, or a combination of these elements. The preferably metal coating 9 in this case can have a layer thickness of 100 μm to 600 μm. In addition to the protection function, the coating 9 fulfills a further function, specifically the provision of an adhesion layer for the temperature/thermal protection layer 10 which is arranged on the coating 9 on the outside. The thermal protection layer 10 in this case can be formed from a ceramic material, like, for example, $ZrO_2$, and on account of its insulating action reduces the thermal stress for the components which lie beneath it. The thermal protection layer 10 can be applied, for example, by a plasma spray process or an electron beam evaporation process.

Figure 3:
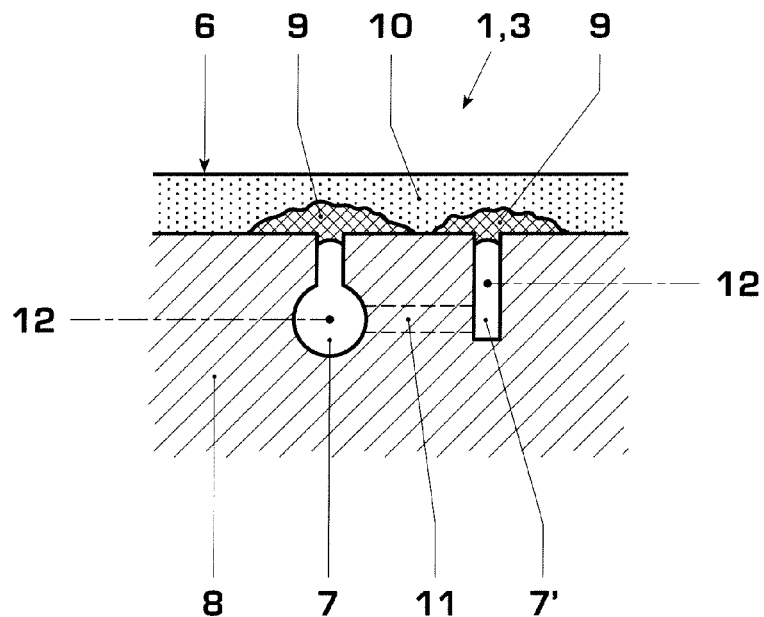
FIG. 3 shows a detailed view of cooling passages which are embedded in the outer wall of the component.
Figure 6:
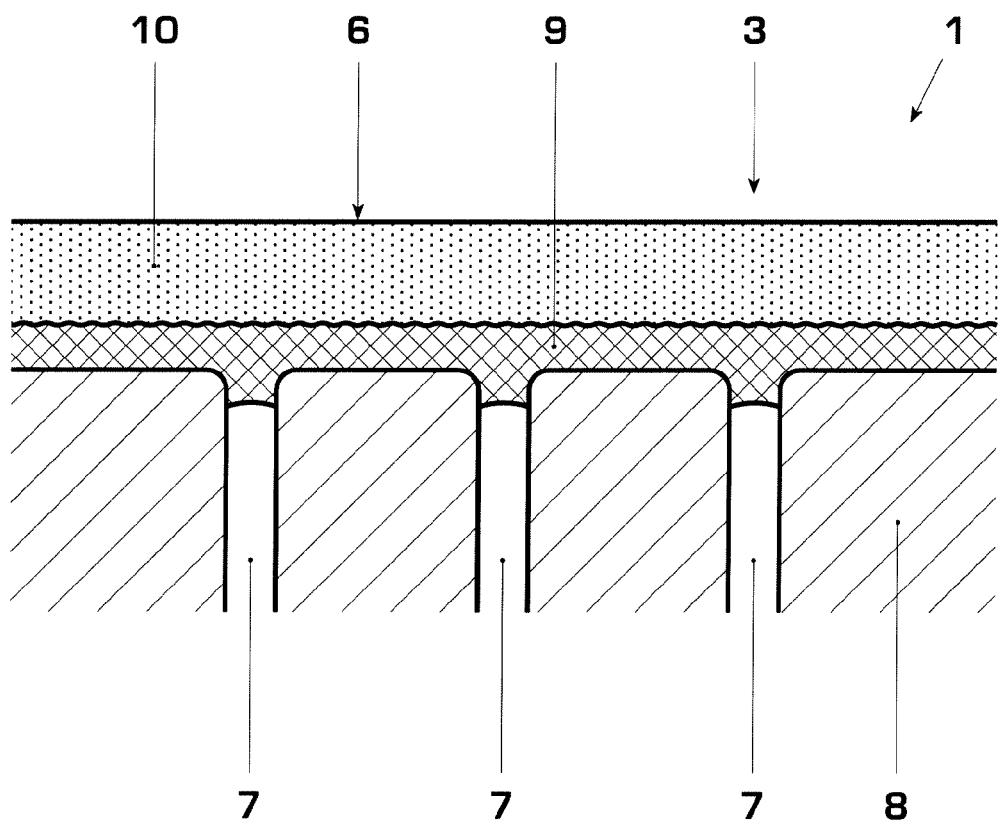
FIG. 6 shows a view as in FIG. 3, of another embodiment.

FIG. 3 shows a detailed cross section in the region of the surface 6 of the component 1 or surface of the blade 3, as the case may be, wherein two passages 7 and 7' are exemplarily shown, which differ in their cross section. The cooling passages 7, 7' in this case are embedded in the basic body 8 and have an opening towards the initially uncoated surface of the basic body 8. As shown in FIG. 3, the openings of the passages 7 and 7' are bridged and closed off by the coating 9 which is arranged in the opening region in each case. In this case, the coating 9, as shown in FIG. 3, can only be arranged in the region of the openings of the passages 7, 7', or they can cover the basic body 8 along its entire surface, as shown in FIG. 6. It is also conceivable that at least one passage 7, 7' communicates with at least one discharge opening, which is not shown, which leads to the surface of the component 1 and as a result creates a film cooling along the surface 6.

In order to fully develop the cooling action of the passages 7, 7', these have to be integrated into a cooling circuit of the turbomachine, so that a through-flow of cooling medium through the passages 7, 7' can be achieved. It is also conceivable that a plurality of passages 7, 7' form a communicating passage network, which is shown according to FIG. 3 by a connecting passage 11 which is shown by discontinuous lines. Furthermore, it is necessary for an effective cooling of the blade 3 or the component 1, as the case may be, that the passages 7, 7' lie as close as possible to the surface 6 of the component 1. Therefore, a passage longitudinal axis 12, which according to FIG. 3 basically extends orthogonally to the illustration plane, is preferably at a distance of less than 3 mm from the surface 6 of the component 1 or the blade 3, as the case may be.

Furthermore, it is advantageous if a length/diameter ratio of at least one passage 7, 7' is greater than five. Furthermore, in order to ensure a reliable closing off of the passage 7, 7' towards the surface 6 of the component 1, a width of the cavity or the passage 7, 7', as the case may be, is less than 1 mm, preferably in the region of about 0.2 mm. In this case, different cross sectional shapes of the passages 7 and 7' are shown according to FIG. 3, wherein the passage 7 tapers in its width towards the surface 6 of the component, while the passage 7' has a constant width.

Figures 4, 5:
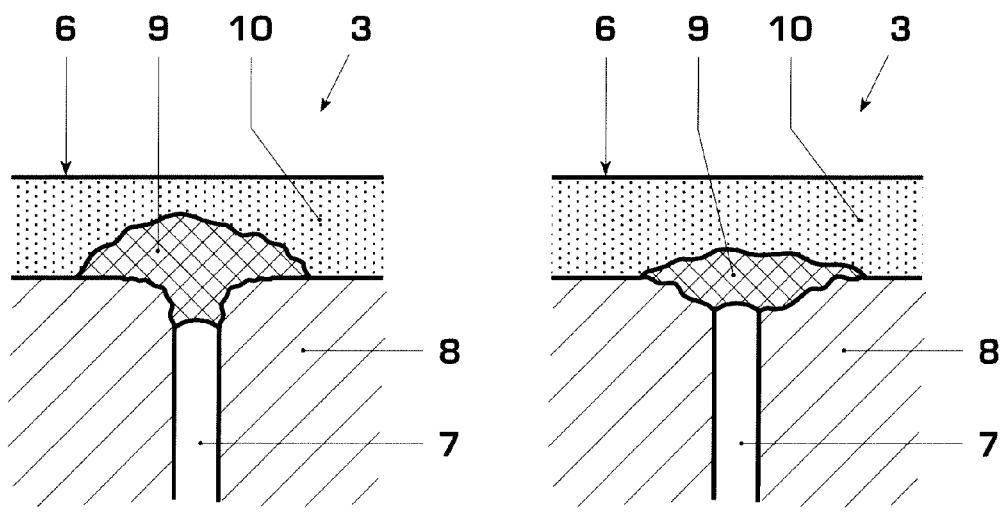
FIG. 4 shows a much enlarged detail of a cross section in the region of the coating which closes off the passage.
FIG. 5 shows a view as in FIG. 4, however with a previously heated basic body.

A directly bridged passage 7 is shown in FIG. 4, wherein the coating 9 in the region of the passage 7 has a pillar-like construction of fine dendrites. The orientation of the dendrites in this case is parallel to the orientation of the substrate of the basic body 8 and at the same time epitaxially hardens with the substrate. This is especially advantageous when the component 1 or the blade 3, as the case may be, is subjected to a cyclic thermal and mechanical stress, as this is the case, for example, in gas turbines. In FIG. 4 it is exemplarily indicated that the side edges of the passage 7 which are oriented towards the coating 9 can melt off or melt down, as the case may be, when applying the coating 9 and can then deviate considerably from the original shape, which is shown by a discontinuously drawn line.

According to FIG. 5, a passage 7 which is produced according to the same method is shown, wherein in this case the structure was modified in an advantageous way, for example by laser melting, after applying the coating 9. Furthermore, the basic body 8 is able to have been preheated, especially by a laser, before the metal forming. As a preheating temperature, for example 1100° C. comes into consideration, as a result of which high temperature gradients inside the interaction zone, and therefore inside a connecting zone between coating 9 and basic body 8, can be reduced. At the same time, the higher ductility of the base material, as result of heating it, and also the lower temperature gradients, contribute to a reduction of a risk of cracks during hardening of the coating 9.

A method for producing at least one passage 7, which is embedded in an outer wall 5 of a component 1 of a turbomachine by coating the outer surface 6, is to be briefly described in the following.

In a first method step, a passage-like cavity, called a passage 7, 7', is first introduced in the basic body 8 of the component 1. This can be carried out, for example, mechanically and/or electrochemically and/or photochemically and/or by a laser, especially by a short pulse laser.

After that, a local surface melting of the basic body 8, at least on the two sides of the passage 7, 7', is carried out, wherein again a laser is also used in this case for melting the basic body 8.

The application and melting of a coating 9, at least in the region of the passage 7, 7', is carried out in one working cycle with the melting of the basic body 8, wherein the coating 9, the process temperature, and the width of the passage 7, 7' are matched to each other so that the molten coating material, owing to its surface tension, does not penetrate into the passage 7, 7'. Therefore, no filling material is required for closing off the passage 7, 7', as this is the case in the production processes according to the prior art. Rather, for example, a metal powder is used, which in the molten state forms a bridge across the passage 7, 7' on account of its surface tension and, as a result, closes this off towards the surface 6 of the component 1. It is important for a preferred embodiment that the material properties of the coating powder are tailored to the respective coating process, so that the creation of a monocrystal structure is benefited. The application of the coating 9 to the basic body 8 can be carried out, for example, by plasma spraying and/or by an electron beam evaporation process and/or by a laser. A LMF method (laser metal forming), especially an E-LMF method (epitaxial LMF), will be preferable for producing an epitaxial coating, and therefore a monocrystalline coating 9, on the basic body 8 which is preferably also monocrystalline.

Finally, a controlled cooling and hardening of the molten coating material can be carried out in such a way that a metallurgical connection to the basic body 8 on the two sides of the passage 7, 7' is achieved, and the passage 7, 7' is bridged towards the surface 6 by the hardening coating material. After that, the surface 6 can subsequently be processed and/or smoothed by a laser, as a result of which a modified surface 6 can be achieved. This "modification" is preferably the creation of a monocrystalline structure inside the coating 9.

The cross sectional shape and the dimensioning of the passage 7, 7' in this case can be accurately controlled, as a result of which the desired cross sectional shape of the passages 7, 7' can be relatively accurately formed and the course of the passage 7, 7' can also be largely accurately defined.

With an LMF method, the melting of the basic body 8 and the application and also the melting of the coating material can be carried out simultaneously, which simplifies the application of the coating 9. The use of an E-LMF method, by suitable selection of the method parameters, creates the possibility of allowing the coating 9 to harden in a monocrystalline manner, wherein at the same time the possibility is presented to basically produce the same crystallographic orientation for the coating 9 and for the basic body 8. By this crystallographic orientation of the coating 9 and the basic body 8, which is the same after cooling, the thermophysical properties of the coating material can be the same as those of the basic body 8, on account of the propagating dendrite arms and the pillar-like growth, as a result of which the service life can be increased.

As already indicated further above, the application of the coating 9 and the surface modification can be designed as a two-step process, in which, in a first step, the coating 9 can be applied to the basic body 8 by a suitable method (see above), and in which, in a second step, the monocrystalline structure can be realized inside the coating 9 by a suitable remelting method, for example by a suitable laser.

By the arrangement or production of the cooling passages 7, 7' according to principles of the present invention, as the case may be, an effective cooling of the component 1 can be achieved, and, therefore, the tolerable turbine inlet temperature can be increased by 50K to 125K. Naturally, the passages 7, 7' which are produced according to the invention can also be combined with other cooling methods, like, for example, a transpiration cooling method.

According to FIG. 6, the coating 9 in another embodiment can also be applied to the basic body 8 so that it extends across a plurality of passages 7 or covers a section of the basic body 8 which includes a plurality of passages 7, as the case may be. It is especially possible to provide the entire surface 6 of the respective component 1, which is exposed to thermal stress, first with the coating 9 and then with the thermal protection layer 10.

Furthermore, when applying the coating 9, attention can be paid to a first phase of hardening of the coating material being of the γ type. By adjusting the method parameters, attention can be additionally or alternatively paid to a so-called CET (columnar-to-equiaxed-transition), therefore a transition from a directed to a globulitic crystal structure, being avoided. For this purpose, it is additionally or alternatively expedient to select the method parameters and the coating material so that, as far as possible, the formation of new crystallization germs when applying the coating 9 is avoided. In this way, an epitaxial construction of the coating 9 on the basic body 8 can especially be achieved.

It is basically possible that the monocrystal structure which is preferred for the basic body 8 is altered as a result of applying the coating 9. By an additional melting process, a reconstruction of the monocrystal structure of the basic body 8 can be expediently achieved. This additional melting process can be carried out, for example, at the same time with the melting of the coating 9, in order to transform in this a polycrystalline structure into a monocrystal structure.

| List of designations | |
|---|---|
| 1 | Component |
| 2 | Region exposed to hot gas |
| 3 | Blade |
| 4 | Blade root |
| 5 | Outer wall |
| 6 | Surface |
| 7, 7' | Passage/cavity |
| 8 | Basic body |
| 9 | Coating |
| 10 | Temperature/thermal protection layer |
| 11 | Connecting passage |
| 12 | Passage longitudinal axis |

While the invention has been described in detail with reference to exemplary embodiments thereof, it will be apparent to one skilled in the art that various changes can be made, and equivalents employed, without departing from the scope of the invention. The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for producing a hot gas component of a turbomachine, the component having at least one passage embedded in an outer wall of the component, the method comprising:
forming at least one passage-like cavity in a basic body of the component;
covering the at least one passage-like cavity by applying a coating material to the basic body;
locally surface melting the basic body at least on two sides of the cavity simultaneous with said applying and with melting the coating material at least in the region of the cavities, wherein the coating material, a process temperature, and the width of the cavity are matched to each other so that the molten coating material does not penetrate into the cavity on account of surface tension; and
cooling and hardening the molten coating material so that the coating material is epitaxially built up on the basic body, achieving a metallurgical connection to the basic body on the two sides of the cavity.

2. The method as claimed in claim 1, wherein said simultaneous melting of the basic body and said applying of the coating material comprises a process selected from the group consisting of plasma spraying, electron beam evaporation, lasering, and combinations thereof.

3. The method as claimed in claim 2, further comprising:
feeding the coating material in the form of powder or wire.

4. The method as claimed in claim 2, wherein lasering comprises an epitaxial laser metal forming process.

5. The method as claimed in claim 1, wherein forming at least one passage-like cavity comprises a process selected from the group consisting of precision investment casting, mechanically forming, electrochemically forming, photochemically forming, laser forming, and combinations thereof.

6. The method as claimed in claim 1, wherein:
a first phase of the hardening of the coating material is of the γ-type, or
in the coating, a transition from the monocrystal structure to the equiaxial structure is avoided, or
in the coating, the formation of new crystallization germs is avoided, or
combinations thereof.

7. The method as claimed in claim 1, further comprising:
smoothing the surface of the coating after said cooling and hardening by laser melting.

8. The method as claimed in claim 1, further comprising:
heating the basic body before and/or during said coating, to reduce stresses which occur by the hardening and/or cooling of the coating.

9. The method as claimed in claim 1, wherein applying the coating comprises applying so that the coating contains a monocrystalline structure and/or is epitaxially connected to the basic body.

10. The method as claimed in claim 1, further comprising:
additionally melting the coating material so that a monocrystal structure of the basic body is reproduced in the coating and/or a polycrystalline structure of the coating is transformed into a monocrystal structure.

11. The method as claimed in claim 1, further comprising:
processing the coating after said cooling and hardening so that the coating contains a monocrystalline structure and/or is epitaxially connected to the basic body.

* * * * *